US012631563B2

(12) United States Patent
Chou et al.

(10) Patent No.: US 12,631,563 B2
(45) Date of Patent: May 19, 2026

(54) METHODS FOR CREATING LARGE-AREA COMPLEX NANOPATTERNS FOR NANOIMPRINT MOLDS

(71) Applicant: The Trustees of Princeton University, Princeton, NJ (US)

(72) Inventors: Stephen Y. Chou, Princeton, NJ (US); Fei Ding, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 18/523,814

(22) Filed: Nov. 29, 2023

(65) Prior Publication Data

US 2024/0344993 A1     Oct. 17, 2024

Related U.S. Application Data

(63) Continuation of application No. 17/394,223, filed on Aug. 4, 2021, now abandoned, which is a continuation of application No. 16/038,963, filed on Jul. 18, 2018, now abandoned, which is a continuation of application No. 14/217,052, filed on Mar. 17, 2014, now abandoned.

(60) Provisional application No. 61/794,317, filed on Mar. 15, 2013, provisional application No. 61/801,933, filed on Mar. 15, 2013, provisional application No.
(Continued)

(51) Int. Cl.
*G01N 21/65* (2006.01)
*B29C 33/56* (2006.01)
*B29C 37/00* (2006.01)
*B29C 59/02* (2006.01)
*G01N 21/64* (2006.01)

*G03F 7/00* (2006.01)
*B29C 33/42* (2006.01)

(52) U.S. Cl.
CPC .......... *G01N 21/658* (2013.01); *B29C 33/56* (2013.01); *B29C 37/0003* (2013.01); *B29C 59/02* (2013.01); *B29C 59/026* (2013.01); *G01N 21/648* (2013.01); *G01N 21/6486* (2013.01); *G03F 7/0002* (2013.01); *B29C 33/424* (2013.01); *B29C 2059/023* (2013.01); *B29K 2995/0005* (2013.01)

(58) Field of Classification Search
CPC .............. G01N 21/658; G01N 21/648; G01N 21/6486; B29C 33/56; B29C 37/0003; B29C 59/02; B29C 59/026; B29C 33/424; B29C 2059/023; G03F 7/0002; B29K 2995/0005
USPC .......................................... 216/41
See application file for complete search history.

(56) References Cited

U.S. PATENT DOCUMENTS 7,780,893 B2     8/2010 Sreenivasan et al.
2004/0046288 A1     3/2004 Chou
(Continued)

FOREIGN PATENT DOCUMENTS

KR          100669552 B1 *  1/2007

*Primary Examiner* — Duy Vu N Deo
(74) *Attorney, Agent, or Firm* — James S. Keddie; Bozicevic, Field & Francis LLP

(57) ABSTRACT

Some embodiments of the invention provide methods that can create large area complex patterns for nanoimprint molds without or with very litter of the use of the charged beam or photon beam direct-writing of nanostructures. Some embodiments of the invention use (i) Fourier nano-imprint patterning (FNP), (ii) edge-guided nanopatterning (EGN), and (iii) nanostructure self-perfection, and their combinations.

1 Claim, 11 Drawing Sheets

Related U.S. Application Data

61/802,020, filed on Mar. 15, 2013, provisional application No. 61/800,915, filed on Mar. 15, 2013, provisional application No. 61/801,424, filed on Mar. 15, 2013, provisional application No. 61/793,092, filed on Mar. 15, 2013, provisional application No. 61/801,096, filed on Mar. 15, 2013, provisional application No. 61/802,223, filed on Mar. 15, 2013.

(56)         References Cited

U.S. PATENT DOCUMENTS

| | | | |
|---|---|---|---|
| 2004/0065252 A1 | 4/2004 | Sreenivasan et al. | |
| 2006/0054507 A1 | 3/2006 | Imada et al. | |
| 2007/0128549 A1* | 6/2007 | Park | B82Y 10/00 |
| | | | 430/296 |
| 2008/0106001 A1 | 5/2008 | Slafer | |
| 2008/0196607 A1 | 8/2008 | Rinko | |
| 2009/0166317 A1 | 7/2009 | Okushima et al. | |
| 2009/0226766 A1 | 9/2009 | Moribe et al. | |
| 2010/0072661 A1 | 3/2010 | Cho et al. | |
| 2010/0078854 A1* | 4/2010 | Berggren | G03F 7/0002 |
| | | | 264/293 |
| 2010/0078855 A1 | 4/2010 | Chou et al. | |
| 2010/0120251 A1 | 5/2010 | Sreenivasan et al. | |
| 2010/0140220 A1 | 6/2010 | Cho et al. | |
| 2010/0173113 A1 | 7/2010 | Ermochkine et al. | |
| 2010/0233377 A1 | 9/2010 | Aoki et al. | |
| 2010/0233432 A1 | 9/2010 | Okushima et al. | |
| 2011/0042352 A1* | 2/2011 | Okushima | B82Y 10/00 |
| | | | 427/299 |
| 2012/0112385 A1 | 5/2012 | Sreenivasan et al. | |
| 2013/0161869 A1 | 6/2013 | Yamamoto et al. | |
| 2013/0237050 A1* | 9/2013 | Kikutani | H10B 43/10 |
| | | | 438/618 |
| 2014/0011013 A1 | 1/2014 | Jin et al. | |
| 2014/0217489 A1* | 8/2014 | Wang | H10D 64/035 |
| | | | 257/315 |
| 2014/0265013 A1 | 9/2014 | Chou et al. | |
| 2015/0036117 A1* | 2/2015 | Menon | B29C 59/16 |
| | | | 264/293 |

* cited by examiner

METHODS FOR CREATING LARGE-AREA COMPLEX NANOPATTERNS FOR NANOIMPRINT MOLDS

CROSS-REFERENCING

This application is a continuation of U.S. patent application Ser. No. 17/394,223, filed Aug. 4, 2021, which is a continuation of U.S. patent application Ser. No. 16/038,963, filed Jul. 18, 2018, which is a continuation of U.S. patent application Ser. No. 14/217,052, filed Mar. 17, 2014, which claims the benefit of: provisional application Ser. No. 61/801,424, filed Mar. 15, 2013, provisional application Ser. No. 61/801,096, filed Mar. 15, 2013, provisional application Ser. No. 61/800,915, filed Mar. 15, 2013, provisional application Ser. No. 61/793,092, filed Mar. 15, 2013, provisional Application Ser. No. 61/801,933, filed Mar. 15, 2013, provisional Application Ser. No. 61/794,317, filed Mar. 15, 2013, provisional application Ser. No. 61/802,020, filed Mar. 15, 2013 and provisional application Ser. No. 61/802,223, filed Mar. 15, 2013, all of which applications are incorporated by reference herein for all purposes.

BACKGROUND

One of the most critical obstacles in developing large-area nanosystems is lack of the ability to nanostructure over large areas. Today we have the tools and technologies to make nanostructures in small area (e.g. microchips), or micro-structures in large area (e.g. large screen TVs); but we do not have the tools and technologies to make complex nanostructures over large areas. For examples, the direct writing of nanostructures by charged (electron and ion) or photonic beams is too slow for large area. This has severely impeded the development and commercialization of many large area nanosystems. Clearly a viable solution to the problem can revolutionize the field. The current invention is related to the methods that can over this problem. The methods invented can create large area complex patterns for nanoimprint molds without or with very litter of the use of the charged beam or photon beam direct-writing of nanostructures

SUMMARY

The following brief summary is not intended to include all features and aspects of the present invention, nor does it imply that the invention must include all features and aspects discussed in this summary.

The invention is related to creating large area complex patterns for nanoimprint molds.

BRIEF DESCRIPTION OF THE DRAWINGS

The skilled artisan will understand that the drawings, described below, are for illustration purposes only. The drawings are not intended to limit the scope of the present teachings in any way. Some of the drawings are not in scale.

FIG. 3. Multi-set nanopatterning (MSN), a new innovative path-changing approach, offers a viable solution to a central challenge in nanomanufacturing (including nanoimprint): generation of complex nanostructures over large-area (>1 meters) without using electron beam lithography or the like.

Corresponding reference numerals indicate corresponding parts throughout the several figures of the drawings. It is to be understood that the drawings are for illustrating the concepts set forth in the present disclosure and are not to scale.

Figure 1:
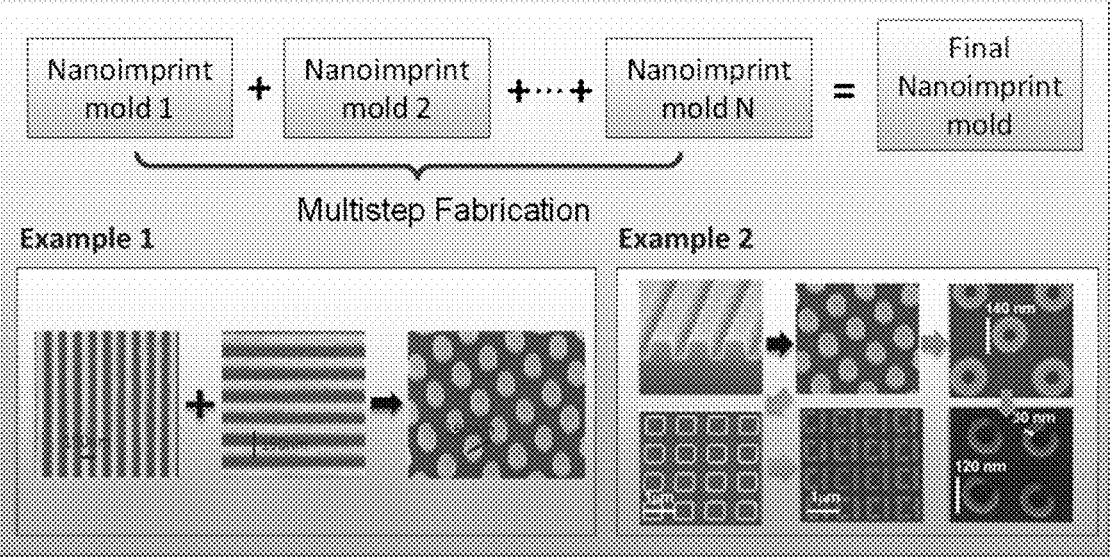
FIG. 1. Multi-set nanopatterning (MSN) based on multiple processing by different nanoimprint molds to form the final mold. Example-1 is a large area 100 nm naondot array formed by fabrication using a large area nano-grating mold. Example-2 shows that MSN can use a large-area nano-grating mold to create large-area nano-dots, which then to the nano-rings, which then the split nano-rings.

Before any embodiments of the invention are explained in detail, it is to be understood that the invention is not limited in its application to the details of construction and the arrangement of components set forth in the following description or illustrated in the drawings.

DETAILED DESCRIPTION OF EXEMPLARY EMBODIMENTS

The following detailed description illustrates some embodiments of the invention by way of example and not by way of limitation.

The following patent applications are incorporated by reference in their entirety: 61/802,020, filed Mar. 15, 2013 and provisional application Ser. No. 61/802,223, filed Mar. 15, 2013.

The methods invented, that can create large area complex patterns for nanoimprint molds without or with very litter of the use of the charged beam or photon beam direct-writing of nanostructures, comprise several basic methods and different of combination of basic methods, that lead to the final desire complex over large area. The technology is termed Multi-set nanopatterning (MSN) and also termed "compositional imprint lithography" (CIL). The two terms are interchangeable in this disclosure.

The basic method A, that creates complex structures on a substrate surface comprises multiple steps of fabrication of daughter molds and multiple superposition of nanoimprint of periodic patterns.

For examples, as shown in FIG. 1, we start with a linear grating and after created a daughter linear grating of the same period, we will do the second imprint with the same linear grating mater with rotating 90 degree angle to create a pillar daughter mold. Now the pillar daughter can become master and being used twice imprint and etching to create aperiodic lattices (see later section of the disclosures). Such lattice are very useful for light extraction in light emitting diodes (LEDs). There many different ways to create complex patterns by using different cycles of the same mater mold, and then use different daughter molds to create granddaughter mold and grand grand daughters, until the final desired complex patterns are achieved. This can be very large area, since nanoscale grating can be produced today meter size. Such periodic pattern superposition is in fact a Fourier transform, with each periodic pattern representing a Fourier component. Detailed analysis and examples are given in the paper attached here as a part of the application.

The basic method B is to have pattern of either micron or nanosize, by shadow evaporation patterns can formed at the edges of these patterns, and its lateral dimension is determined by the film thickness, in this way micro patterns become nanoscale patterns. One also can oxidize or conformal depositions to form nanometer edges patterns.

By doing multiple steps of A and B to create daughter and granddaughter and grand grand daughter molds, complex patterns over large area can be created without using the writing of a focused beam.

In other embodiments, the MSN is based on the two principles: (a) the large-area nanoimprint mold with the desired nanostructures can be composed (fabricated) by using several primary molds with each of them having only a part of the structures on the final mold, and (b) the nanostructures on a primary mold can be made by "converting" a microstructure to a nanostructure, or "converting" large-area simple nanostructures (e.g. by interference lithography) into large area complicated structures using conventional micro fabrication methods. Each of two processes can be used intermixed and multiple times to build very complicated nanostructures over large area. Once a large area master mold is made, it can be duplicated to multiple copies for mass production.

Figure 2:
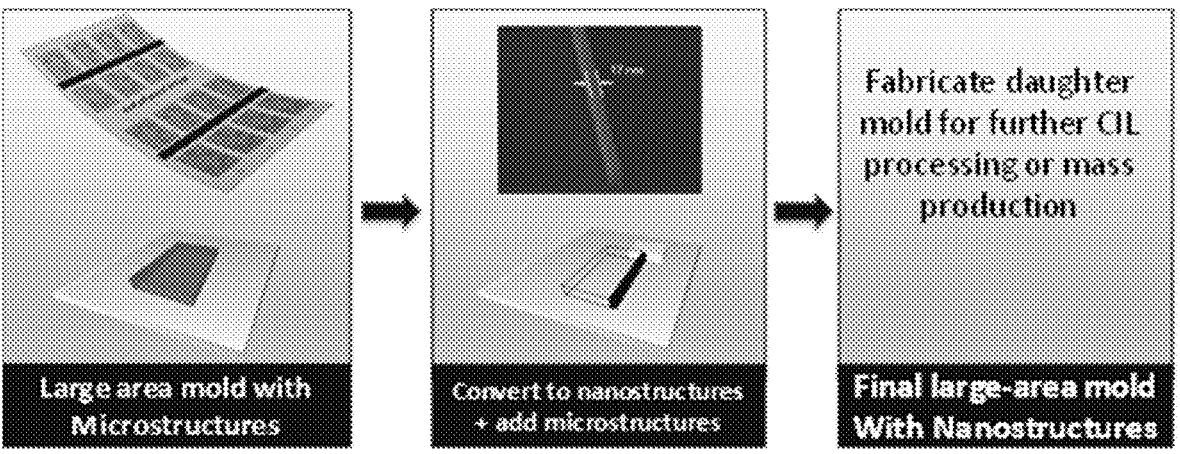
FIG. 2. One embodiment of Multi-set nanopatterning (MSN) is to "convert" microstructures on a large area mold to "nanostructures" and to add new microstructures.

FIG. 2 illustrates that a nanogate/nanowire can be fabricated by using edge patterning (film deposition or shadow evaporation) of microstructure. The Example-1 in FIG. 1 shows that a large area 100 nm dots can be formed by two cycles of nanoimprint and etching using a large area grating mold (the second imprint rotates the mold by 90 degree). The Example-2 shows the SEMs (demonstration) that MSN can use a large-area nano-grating mold to form large-area nano-dots, which then to form the nano-rings, which then the split nano-rings, and which then split-nano-ring. The ring is formed by oxidizing a pillar or by conformal thin film deposition of pillar (and etch away the unwanted parts). The (single or double) split of the ring is formed by shadow evaporation. All these fabrication steps (except nanoimprint) use only the conventional microfabrication processes.

One central issue in nanomanufacturing is to generate complex nanopatterns over large area with high-throughput and low cost, particularly for the feature size less than 100 nm and pattern pitch less than 200 nm (i.e. below 100 nm node in semiconductor ICs) in an area larger than 100 cm2 (or even to wall pager size). Advance in this area will have significant impact to a wide range of industrial applications, well beyond semiconductor ICs, such as new materials, solar cells, solid state lighting, fuel cells, data storage, optical communication, displays, biotechnology, to name a just a few.

For fabricating sub-100 nm patterns of sub-200 nm pitch, scanning laser does not have sufficient resolution nor the needed throughput, scanning electron lithography is too slow, and deep-UV lithography (main workhorse for semiconductor ICs) is too expensive for the most products outside of IC and is unapplicable to the flexible or thin film substrates and/or the area larger than 300 mm diameter.

Nanoimprint is regarded as one of emerging technologies that will change the world and one of the most important manufacturing technologies in the $21^{st}$ century.

However, nothing can be imprinted without a mold (template); one must have a mold first in nanoimprint. Thus, nanoimprint faces the same challenge as other nanomanufacturing: generation complex nanostructures over large area—although in nanoimprint, such generation is needed only once: the master mold. Hence, making the master mold with large area complex nanostructures is the most serious obstacle or the Achilles in nanoimprint.

Clearly, conventional approaches are impossible to meet needs for nanoimprint master mold fabrication and nanomanufacturing. Hence, a solution to large-area complex nanostructure generation will have transformative impact to nanomanufacturing, and nanotechnology.

The invention is related to the methods to generate complex nanostructures over a large area without using electron beam lithography (EBL) or the like.

The proposed research is to explore a new innovative path-changing approach, termed "multi-set nanopatterning" (MSN), that offers a viable solution to a central challenge in nanomanufacturing (including nanoimprint):

The MSN comprises three innovative nonconventional technologies and their creative superposition(s) (i.e. multiple uses). The three technologies are (i) Fourier nanoimprint patterning (FNP), (ii) edge-guided nanopatterning (EGN), and (iii) nanostructure self-perfection. Just each individual technology alone, it already can create new complex nanostructures over a large area that could not be generated before; but when combined together, they can generate far more complex nanopatterns over a large area. Furthermore, the proposed research will advance new approaches in nanoimprint mold duplication and will use large area nanoplasmonics and roll-to-roll nanoimprint as test bed for the technologies to be developed. The research outcomes are expected to have transformative impacts to nanomanufacturing and multiple multi-billion-dollar industrial fields.

The invention is related to a number of different new approaches for large-area complex nanostructure generation for many years. Based on the innovation developments made by our group and others, plus new concepts we generated recently, the proposed research aims at a new innovative approach to generate large area complex nanostructures without using EBL, termed "multi-set-nanopatterning" (MSN). MSN includes three types of paradigm-shift nanofabrication technologies as well as creative superposition(s) (i.e. multiple uses and different combinations) of them (FIG. 2). The three paradigm-shift technologies are (i) Fourier nanoimprint patterning (FPN) (FIG. 5), (ii) edge-guided nanopatterning (EGN) (FIG. 2.2), and (iii) nanostructure self-perfection by liquefaction (SPEL). These technologies will be developed with the test bed of nanoplasmonics for solar cells, solid state lighting and other optical applications, and of roll-to-roll nanoimprint master molds.

Fourier Nanoimprint Patterning (FNP) creates a desired final complex nanopattern by superpositioning its Fourier components. Specifically, the final nanopattern is a result of several nanoimprints of "simple patterns", each of them is one or several Fourier components of the final nanopattern (e.g. gratings or grids with different periods) The superposition is done by sequentially adding a new simple pattern onto the patterns that are already imprinted and fabricated on a substrate. FNP can generate large-area complex nanostructures, because (a) currently large-area linear nanogratings become commercially available, and (b) nanoimprint allows making daughter molds for intermediate and final nanostructures to be made, which greatly simplifies the fabrication process and cost of FNP.

Figure 10:
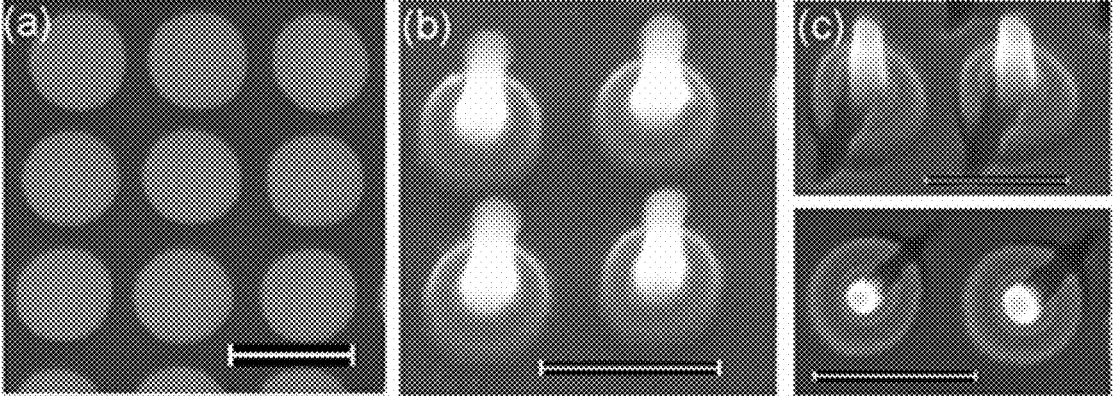
FIG. 10. SEM pictures of the split-ring fabrication. (a) Conformal SiNx deposition; (b) Selectively etching down SiNx to expose central SiO2 pillar; (c) Single cut on the surrounding SiNx ring. (Scale bar: 200 nm).
Figure 11:
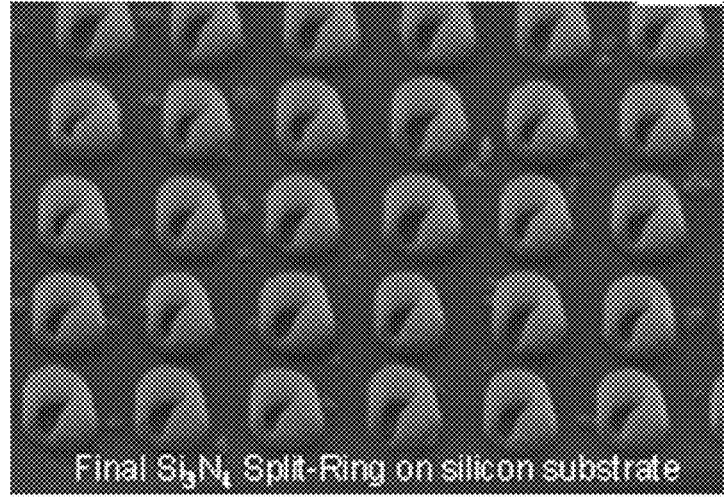
FIG. 11. SEM of single split ring mold by FNP.
Figure 11:
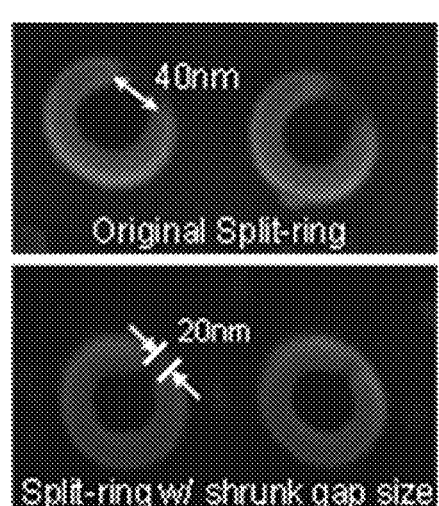

Edge-guided nanopatterning (EGN) uses an edge(s) of an existing micro/nanoscale pattern to create smaller and/or complex patterns. For example, EGN "converts" a micro-rectangle into a nanowire, and a nano-cylinder into nanoring; and for a lesser known example, a micro-rectangle into nanosplit and a symmetric micropattern into an asymmetric nanopattern (FIG. 10, 11).

Nanostructure self-perfection is a class of methods that changes an imperfect structure into perfect one. The main focus here will be "nanostructure self-perfection by liquefaction" (SPEL), although other self-perfection methods will also be used.

1. Fourier Nanoimprint Patterning (FNP)

Figure 5:
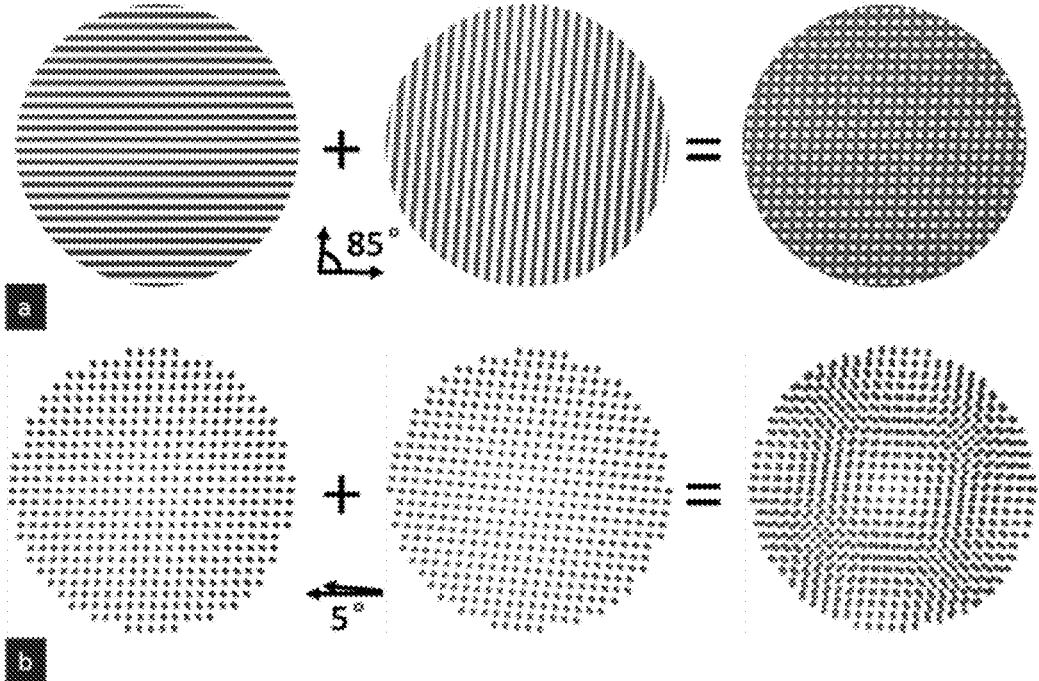
FIG. 5. Schematic of generation of nanopatterns with varying shape, spacing and density by FNP. (a) Double imprint cycles of a linear grating with an angle (e.g. 85°) to create a pillar array mold. (b) Double cycles of imprinting of the pillar array mold to the final patterns of pillars with varying shape, spacing and density. (chou group FIG. 6. Nanodots array with varying shape, spacing and density by FNP. The rotation angle is 85 degree. Note the gaps as small as 2 nm are produced.

Fourier nanoimprint patterning (FNP) creates a final complex nanopattern by superpositioning several nanoimprints of "simple patterns", where each of them is one or several Fourier components of the final nanopattern. The superposition is done by adding the simple pattern sequentially onto the patterns that are already imprinted (and fabricated) on a substrate (FIG. 5).

FNP can create complex nanopatterns over an area, as large as several meter squares, because of four facts: (1) every pattern is a superposition of Fourier components which in turn are either simple linear gratings themselves or a superposition of linear gratings; (2) large-area (square-meters area) nanogratings are now commercially available; (3) multiple methods can be used to manipulate some Fourier components, and (4) nanoimprint can be used to make daughter molds for FPN's intermediate nanostructures, which greatly simplifies the fabrication process and cost of FNP.

The FNP concept was originated by the PI in 1998 for forming large-area periodic nanopillar/hole array]. Recently, the PI proposed new approaches to further advance FNP concept for fabrication of much more complex nanostructures over a large area, which will be a key part of the proposed research. Below, we use some of our work as examples to illustrate FNP and discuss the proposed research in FNP. However, it should be pointed out: FNP can be used many different ways to generate different nanostructures, hence the illustrations here are just a very small set of broad possibilities.

Example 1.1 Making Large-Area Nanopillar or Nanogrid Array by FNP

Figure 3:
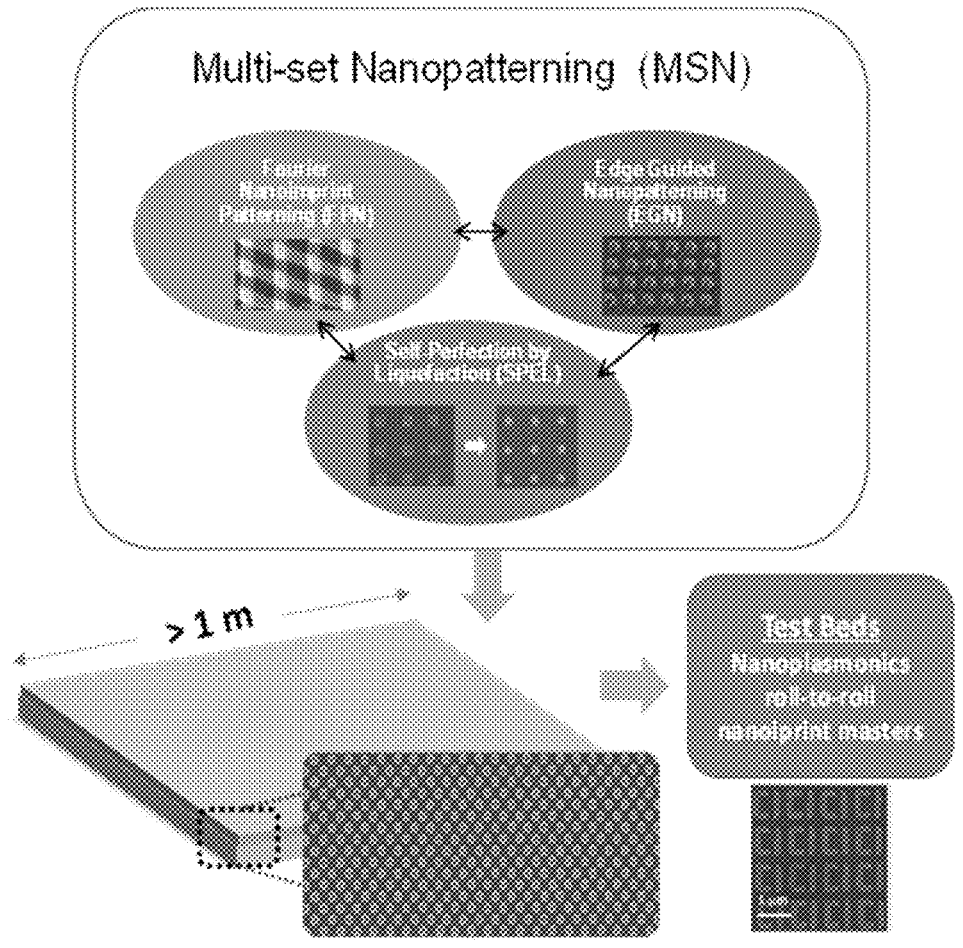
Figure 4:
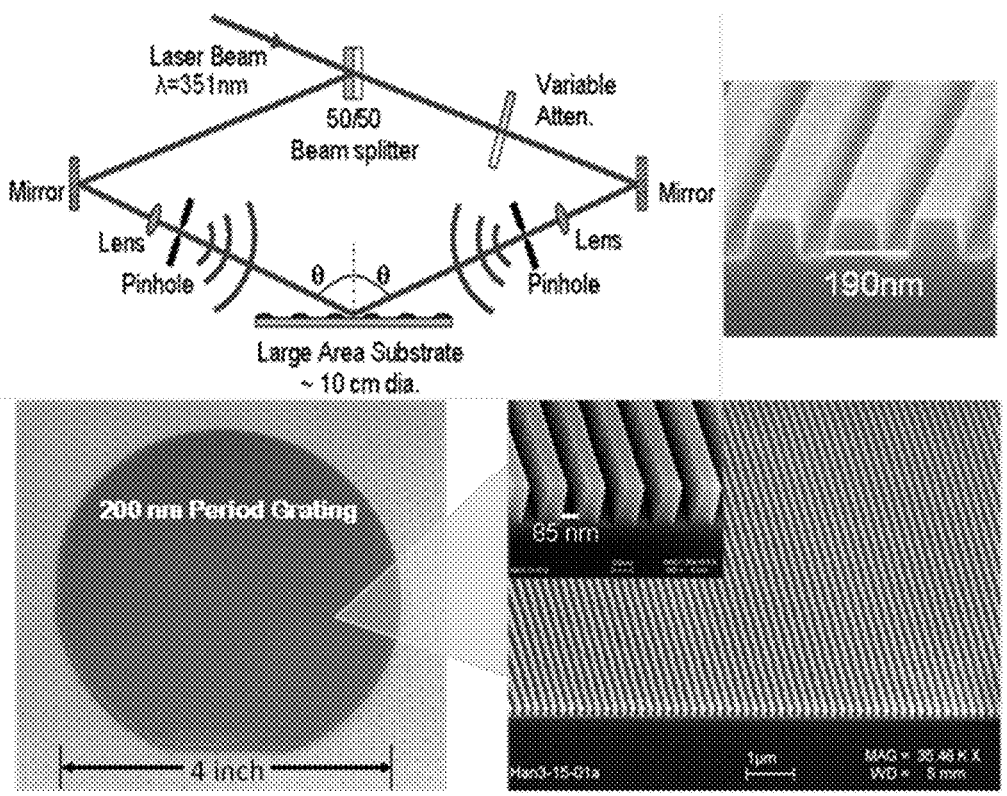
FIG. 4. Shows some of the principles of interference lithography.

A 2D nanopillar/nanogrid array can be generated by superpositioning two linear gratings (each represents one Fourier component) with one in x-direction and another in y-direction. Specifically, first, we fabricated a master mold of 200 nm period linear grating over entire 4" wafer by interference lithography (FIG. 4)]. In FNP, the linear grating master mold is used to fabricate a daughter mold in two cycles of nanoimprinting and Cr lift-off. The first cycle creates a Cr linear grating on the daughter mold substrate. The second cycle, which puts the master mold perpendicular to the direction of the first Cr grating, generates a final Cr pattern of nanogrid on the daughter mold substrate. Finally, Cr grid is used as an etching mask in etching the substrate and is removed after the etching, leaving a 2D nanogrid daughter mold (FIG. 3).

Many variations can be used here. For examples, (a) if the rotation angle of the master mold in the second imprint and lift-off cycle is different from 90 degree, the parallelogram shape array will be generated; (b) the use of two different period of linear grating creates rectangle grid, rather than square grid; (c) with a nanogrid mold, nanopillar mold can be created by imprint and etching; and (d) the square pillars can be changed into circular pillars with a smooth vertical sidewall by SPEL (See Task-3) and other techniques.

Example-1.1 Making Nanopillar Array with Varying Period, Separations by FNP

In many applications, they need nanostructures that have a broad band of resonant frequencies rather than a single frequency for manipulating light. Such applications include solar cells and LEDs which are broad band optical devices. A broad band frequency can be only achieved by using nanostructures that are equivalent of a superposition of multiple different-frequency Fourier components (i.e. multiple different period linear gratings). To have polarization independence, it requires the nanopatterns symmetrical in both x and y-directions. Such broad brand structures are very difficult to generate by conventional approaches.

Figure 6:
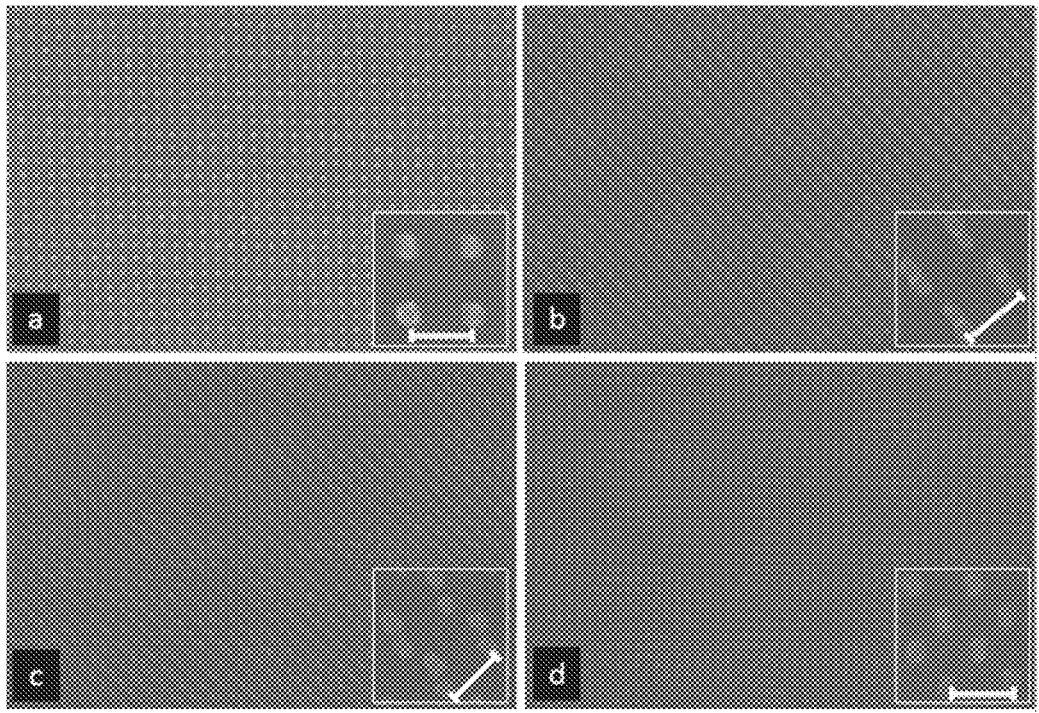

Recently, we invented in a new innovative method, termed "double imprint of pillar-array" (DIP), to generate such broad-band patterns using FNP. The principle of DIP is to create a final complex broad-band structure by double cycles of nanoimprint and Cr deposition using a pillar-array mold. The pillar mold was made, in turn, by double cycles of imprinting/fabrication of a linear grating mold, and the two gratings are not in 90 degrees (orthogonal direction) but having h a rotation angle offset of $\theta_1$ (FIG. 5). And in the double imprinting of the pillar mold, the two imprints are further offset by another angle offset of $\theta_2$. After using Cr as an etching mask to etch the substrate, the 3D Cr become a complex 2D patterns in the daughter mold, that have nanopillar array with linearly varying pillar shape, spacing (pillar period) and density. For using 200 nm period grating, we have demonstrated a 1 nm/200 nm pitch linear increment in pillar's shape and spacing (FIG. 6A, B).

Mathematically, we have:

$$L = \frac{p}{\sin(\theta_2)}$$

$$\Delta = \frac{2p}{\sin(\theta_1)}\sin\left(\frac{\theta_2}{2}\right)$$

where L is the repeat unit length of the superpositioned pattern (i.e. the (rhombus) edge length in FIG. 6B); p is the original linear grating period; and $\Delta$ is defined as the linear increment of the center-to-center distance of the adjacent dots along the long range pattern unit edges.

When $\theta_1 \approx 90°$ and $\theta_2 \approx 0°$, it can be further simplified to be $\Delta = p\theta_2 = p^2/L$.

For example, if grating pitch is 200 nm and misalignment angle is 0.5°, the long range rhombus unit edge length will be L=22.9 μm, with the linearly increment as Δ=1.74 nm/200 nm pitch. Sub-nm increment could be achieved with this method, if the second alignment mismatch angle can be further reduced (e.g. smaller than 0.28° for 200 nm pitch). Moreover, the density of the dots will be doubled after the center-to-center distance goes larger than the dot diameter, or, in other words, after the dots separate. Detailed derivation of the center positions of pillars is shown in supplement material.

Clearly, such broad pillar arranges have enormous application solar cells, solid state lighting, chemical and bio-sensing and other areas, where there are enormous developments in devices (including the PI's group).

Example 1.3 Other FPN Patterns Methods

Clearly, there are unlimited ways to do FPN to create desired final structure (the only limitation might be our imagination). If m is the number of times of nanoimprint of linear grating masters/etchings, the final superpositioned pattern will be mathematically given by [Chou, et al, patent appl.]

$$M = \sum_{i=1}^{m} a_i \sin\left(\vec{k_i} \cdot \vec{r} + b_i\right)$$

Where for the $i^{th}$ grating $\vec{k_i}$is the grating wavevector ($|\vec{k_i}|=2\pi/p_i$, $p_i$=period of $i^{th}$ grating, and the direction is normal to the grating direction), $\vec{r}$ is the position vector in x-y plane, $a_i$ is the $i^{th}$ amplitude, and $b_i$ is the phase difference (duo to the linear shift).

To explore the new desired nanopatterns over a large area by FNP, we will, in the proposed research: (1) study and improve the FNP's feature size control and fidelity; (2) further explore various nanostructures made by FNPs that are important for solar cells, solid state lighting, and bio/chemical sensing, particularly those demonstrated in Sec. 12; and (3) use, improve, and develop the FNP methods that can reduce the final nano-pattern's period and feature sizes. (Note: Currently, we produce 200 nm period grating on 4" wafers and get 140 nm period commercially, which is very expensive for the proposal budget).

2. Edge-Guided Nanopatterning (EGN)

Figure 7:
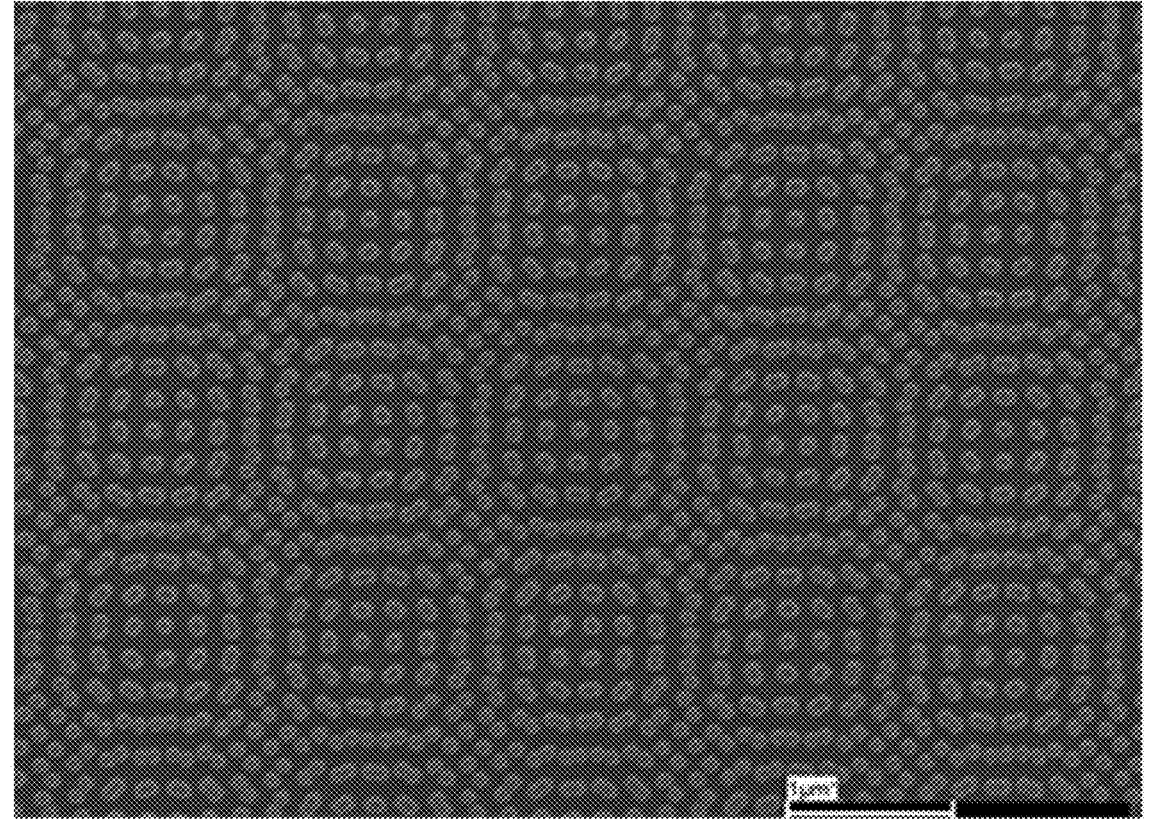
FIG. 7. Nanodots array with varying shape, spacing and density by FNP. The rotation angle is 30 degree, which produces a period short than 85 degree. Again 2 nm gaps are produced.

Edge-guided nanopatterning (EGN) uses an edge(s) of an existing micro/nanoscale pattern to guide the creation of smaller and/or complex nanopatterns. EGN provides three powerful and unique capabilities in nanofabrication. (1) EGN creates a nanostructure from a microstructure and does not need nanostructure mask/mold. A well-known example is a shadowing or deposition on the sidewall of a micro-structure. Therefore large area microstructures (e.g. display size) can be created first and then are turned into large-area nanostructures (FIG. 7). The PI used such an approach to fabricate 60 nm MOSFETs about ~30 years ago; and EGN is also used in modern IC fabrication, being called "double patterning". (2) EGN changes nanostructure into different often hard-to-make shapes. And (3) EGN creates aperiodic structure from a periodic structures. Let us give examples in (2) and (3).

Example 2.1 Nano-Rings from Nano-Pillars by EGN

Figure 8:
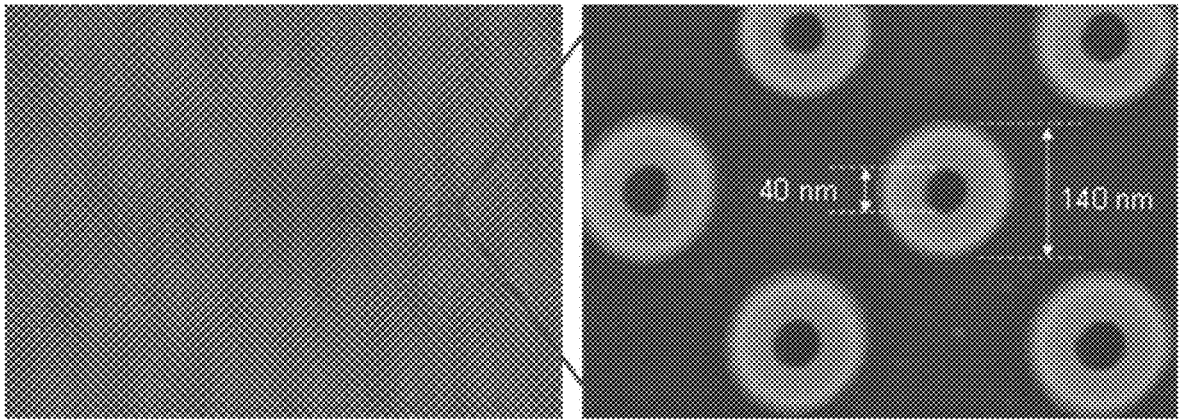
FIG. 8. SEM of ring array with 200 nm pitch, 40 nm and 140 inner and outer diameter, respectively. Fabricated by FNP and EGN.

Once a large-area nano-pillar array is fabricated (e.g. using FPN discussed before), it can be turned into a large-area nano-ring array by EGN. One way to do it is to conformably deposit a thin layer on the pillars and etch away the materials deposited on the pillar's top and foot, but not on the sidewall, and then selectively etching away the pillars, leaving the materials deposited on the sidewall on the substrate, forming the ring array (e.g. SiO2 pillars with SiNx as the deposited material). In case of Si pillars, the confor-mal material deposition also can be replaced by oxidization of Si (e.g. the nano-rings we fabricated FIG. 8)

Example 2.2 Nanoscale Single-spilt-Rings from Nano-Pillars by EGN

Figure 9:
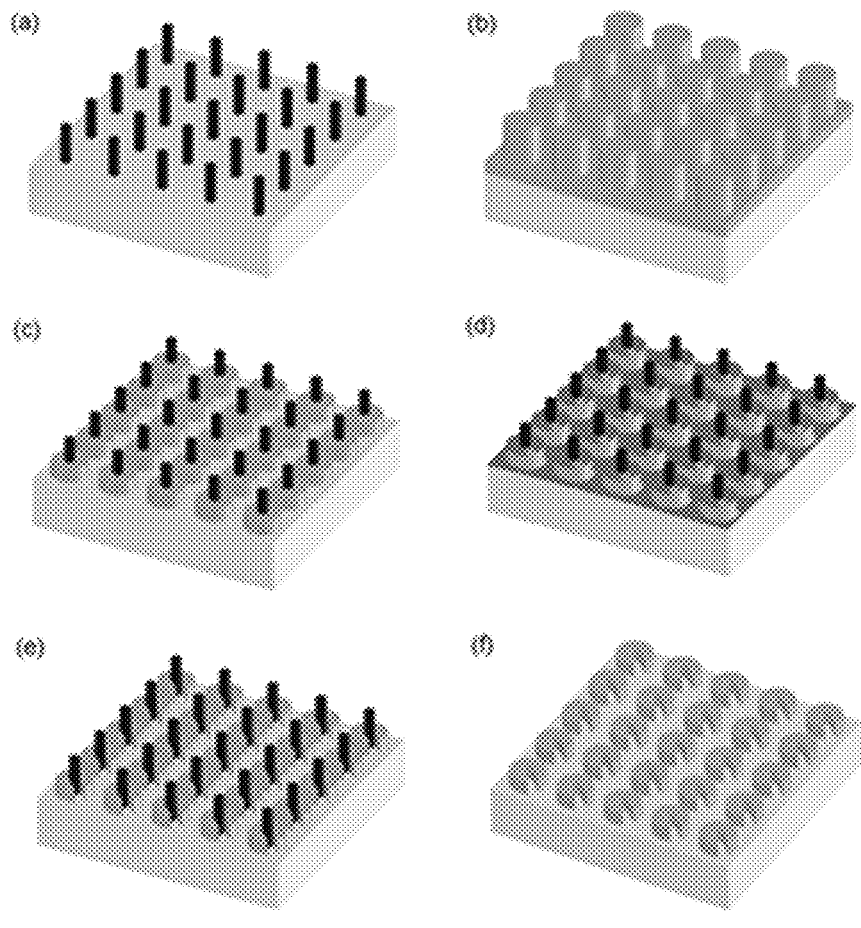
FIG. 9. Fabrication process of nanoimprint mold for split-ring devices: (a) SiO2 pillars fabricated by interference lithography and nanoimprint; (b) conformal SiNx growth over the pillars fabricated in (a); (c) etching down SiNx by reactive ion etching to expose the SiO2 pillar; (d) oblique evaporation of Cr using the SiO2 pillar as shadow mask; (e) etching into shadowed SiNx to make a cut on the SiNx ring; (f) removal of SiO2 pillar by HF.

Large-area nanoscale single-split ring array also can be fabricated from nanopillar array using EGN. The first few steps of the fabrication are similar to that for the nanoring array. But during the anisotropic (vertically) etching of the deposited material on the top and bottom of the pillar, the etching time is made to be sufficient longer, so that after the etching the height of the material deposited on pillar side-wall is much lower than pillar height, making a part of the pillar stick out (e.g. SiO2 pillar SiNx conformal deposition). Then a shadow evaporation of Cr from an angle will deposit Cr everywhere on the sample surface, except behind the stick-out pillar (similar to the shadow of a telephone pole under the 10 am sun). The Cr will be used as an etching mask, and the etching will etch only the area that is not covered by the Cr (i.e. the shadow), which cuts through each ring. After removing the Cr and the pillars, a single-split ring mold is generated (FIG. 9, 10, 11).

Example 2.3 Nanoscale Double-Split-Ring Array from Nano-Pillar Array by EGN

EGN can be used to generate large area double-split nanoring arrays. The starting nanopattern is a square pillar array. An EGN is used to create a square-ring mold. The mold then imprints square ring trenches in a resist on a substrate. Then in a second EGN, where three shadow evaporations of Cr from different angles guided by the edges of each square ring, creates Cr square rings, each has a double split. The Cr is used as the etching mask in etching the substrate, which becomes the final daughter mold of double-split ring array.

Example 2.4 New Innovations and Research in EGN

Clearly, again, the above are just a few examples that EGN can create; and there are a plenty of new ways yet to be explored (again our imagination is the limit). We will focus on the researches in two areas.

(i) New EGN Approaches to Generate Other Complex Patterns.

In EGN, the final complex pattern is determined by the starting material shape, the edges used as the guiding, deposition (or growth) of the materials, the deposition angles, the number of depositions, etc. as well as the combination (and or repeat) of different individual parameters. Clearly, the possibilities of EGN are unlimited, as said before. We will explore each of these parameters and their combinations. We will develop new EGN for fabricating the popular complex nanopatterns that currently must use EBL. Such patterns include triangle array, bowtie array, various complex patterns needed for our nanoplasmonic solar cell and LED test-bed (See Task 6).

(ii) Scaling the Size of Complex Patterns Created by EGN. We will explore the key factors that affect the feature size and size control in EGN, such as resist thickness, etching depth, and deposition thickness. To measure the material layer thickness and other vertical critical dimensions by various techniques such as ellipsometry, spectrometry, and scanning probe-based methods will be used. For measuring lateral dimensions and directly observing 3D topology, high-resolution SEM, TEM, and atomic force microscope (AFM) will be used. The measurements will be feedback to fabrication controls, and fabrication equipment will be improved to increase accuracy.

3. Nanostructures Self-Perfection by Liquefaction (SPEL)

Nanopatterning defects, the deviations of nanostructure shapes from the ideal design, are unavoidable in any nanofabrication methods today, and become worse as a nanofabrication method is near its intrinsic limit. The defects include edge roughness, slopped sidewall, rounded top, small aspect-ratio, and non-circularness of circles/disks, etc.

Clearly, we have not found a new nanofabrication method that can avoid the defects. Therefore, an alternative approach to remove the fabrication defects is to remove the defects after the fabrication, rather than change the fabrication method. To remove the defects over a large area in a short time, the removal method must be "self-perfecting", which means "one simple action" removes the defects everywhere on the entire large-area sample.

Recently, we have been developing a new self-perfection method, termed "self-perfection by liquefaction" (SPEL). SPEL turns an imperfect structure into perfect one by fast liquefying the structure while subjecting the structure to a set of boundary conditions. Under the set of boundary conditions, the perfect shape of the nanostructure in liquid is the energy minimum, while the imperfect one is not; so that in reaching the thermal equilibrium, the imperfect shape "automatically" changes to the perfect one.

Clearly, in SPEL, the key is to find the "correct set" of boundary conditions for the desired perfect structure. Again there are no limits in designing suitable boundary conditions. Below, we will discuss innovations that we have developed, and discuss the proposed research.

It is a well-known and well-practiced method to thermal flow a polymer structure (e.g. resist structure) to remove LER or form circular patterns, since, for the given condition, the smooth edges and circular shape are the energy minimum of liquid in the thermal process. However, such a process has two problems: (a) the shapes are not perfect shapes (as desired), since after the heating, the shape has slopped sidewall, wider foot print, rounded top and smaller aspect ratio, and (b) the process can be applied only to the polymer with low flow temperature, not to the hard materials such as metals and inorganic semiconductors (e.g. Si).

To solve these problems to turn a defected shape into a real perfect one, we made two innovations (1) we invented several sets of new boundary conditions, where the perfect shapes are the energy minimum, and (2) we used a pulse (20 ns) excimer laser to selectively melt a hard material (e.g. Si or Cr) without significantly heating the substrate (the excimer layer melts only ~300 nm thick surface materials that absorb the laser, similar to LASIK eye surgery). The innovation allows self-perfection in hard materials. SPEL was used to smooth Si lines.

Capped-SPEL (C-SPEL)

For example, one new set of boundary condition that we developed is the "capped-SPEL" (C-SPEL), which puts a single plate on top of the structures to be perfected (an individual plate per structure). Under the new boundary condition, the top surface of the structure is no longer free, but has to be flat and in contact with the top plate during the flow ("liquid") state, leading to a flat top and vertical smooth sidewall after the flow. (Note: The vertical sidewall is also required by the energy minimum, which first observed by us and later proved theoretically using a simple parallel capacitor model).

Gapped-SPEL.

Another new set of boundary conditions that we developed is "Gapped-SPEL" (G-SPEL), which puts a single plate on top of the structures to be perfected but with a gap between the two (i.e. no contact). Under the G-SPEL boundary condition, during the flow, the structure to be perfected raises up to touch the surface of the top plate, making the structure narrower, taller, and with smooth, vertical sidewall. G-SPEL has been demonstrated in both for Si and Cr.

In SPEL, we used micro-spacers to control the final gap between the guiding plate and the substrate, and Air Cushion Press to apply uniform pressure between them.

Other self-perfection technologies will also be used in MNF, although it is not the major research focus here. Such technologies include (i) crystalline anisotropic etching to remove line edge roughness (LER) (e.g. etching with the grating lines aligned to the (111) planes of a (110) orientation Si wafer), and (ii) guided-self-assembly of diblock copolymers, where we have extended researches previously.

Our research will focus on (1) the exploration of new boundary conditions to different self-perfection requirements, which include the change of surface energies, multilayer and multi-material systems, (2) the methods of scaling up to very large area (e.g. Air Cushion Press), (3) fundamental science of SPEL, and (4) different applications of SPEL in MSN.

4. Exploration of Multi-Set-Nanopatterning (MSN) for Nanoplasmonics and Roll-to-Roll Nanoimprint Multi-set-nanopatterning (MSN) is a paradigm-shift approach to creating complex nanostructures over a large area, which uses three types of nonconventional nanofabrication technologies and creative superposition(s) (or multiple uses) of these technologies. As discussed before, the three paradigm-shift technologies are (i) Fourier nanoimprint patterning, (ii) edge-guided nanopatterning, and (iii) nanostructure self-perfection by liquefaction.

Clearly, there are unlimited ways for MSN. Our research here will be in three areas: (1) explore some creative ways to combine (superposition) the three fundamental technologies for making the nanostructures without EBL that is drastically different from what have made today; (2) explore the specific MSN that will make nanostructures needed for solar energy, solid-state lighting, and other metallic metamaterials (e.g. negative index materials); and (3) explore the MSN approaches that are important to the roll-to-roll master mold fabrication.

An example of the test bed is a new nanoplasmonic solar cell that we proposed and demonstrated. The new solar cell, termed plasmonic cavity with subwavelength hole-array" (PlaCSH) solar cells with a 85 nm thick photovoltaic layer (poly (3-hexylthiophene)/[6,6]-phenyl-C61-butyric acid methyl ester (P3HT/PCBM) bulk hetero-junction) have: (a) A light coupling-efficiency/absorptance as high as 96%, average 90%, broad-band, and Omni acceptance; and (b) a power conversion efficiency under standard solar irradiation that is 52% higher than the same structure except the cavity, and nearly 180% when in the cloudy day, due to the light acceptance is nearly independent of the incident angle.

As the first team to demonstrate roller nanoimprint (as well as planar nanoimprint), PI's group has several roller nanoimprint tools. The roller nanoimprint tools will be used as demonstrate for the large-area complex nanostructures.

5. High-Fidelity Replication of Nanoimprint Molds

High fidelity and fast duplication of daughter molds are critical to the proposed research and future nanomanufacturing. Recently, we have developed an approach in large-area mold duplication that offers a solution to this issue. We will use and improve this approach in the proposed research.

Our approach has several novelties: (1) the mold duplication process is simple and fast by depositing polymer layers and bonding a backplane, (2) the front size layer is customer high-Young's modulus polymer rather than soft PDMS, giving high imprint resolution and fidelity, (3) the mold has an easy demolding surface, and (4) the mold is flexible.

Specifically, our mold, termed "High-fidelity flexible mold" (HiF2M) consists of a 3-layer structure. The very top layer is high-fidelity fluorinated polymer, as carrier layer of nanopatterns; the top layer is bonded by the middle layer on to the flexible substrate. The high-fidelity fluorinated polymer features a fluorine-rich backbone structure with optimal molecular weight, so it exhibits high stiffness (>90 MPa), low surface energy, and high chemical stability. Those features allow sub-30 nm high-resolution patterns, easy mold release, and chemical mold cleaning, respectively.

We achieved sub-30 nm feature size in the 3-layer HiF2M mold. We even observed a 2 nm-gap between nanopillars on HiF2M mold. We also fabricated large-area HiF2M mold (50 cm by 20 cm) on a PET sheet. By comparison of the master mold, daughter mold, and imprints by the daughter mold, we found that the duplication method exhibits high fidelity. The pattern pitch on HiF2M is only 0.8% deviated from the original master mold with feature size of only 0.7% deviation. Both are smaller than measurement error (1%), indicating that there is no substantial distortion associated with the mold duplication process. The high fidelity and high uniformity in duplication promises the feasibility of future mold manufacture.

Our research will use the above technologies in MSN developments, and will further advance such mold technologies, including the uses of the front surface materials with even higher mold fidelity and durability, the refinement of each layer (their materials' properties and thickness) and the material formations (by ourselves).

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of present invention is embodied by the appended claims.

What is claimed is:

1. A method for creating a nanoimprint mold of a nanopattern, comprising:
   (a) providing a nanoimprint mold substrate with a surface made of silicon, wherein three-dimensional nanopatterns are created in the silicon surface;
   (b) oxidizing the sidewalls of the silicon nanopatterns to form silicon dioxide on the sidewall; and
   (c) removing a portion of the remaining silicon inside of the silicon dioxide sidewall, while leaving a portion of silicon dioxide sidewalls on the nanoimprint mold;
   wherein the remaining portions of the silicon dioxide sidewalls become the structures for sequential nanoimprint, and wherein the three dimensional nanopatterns are pillars and the part of the silicon dioxide sidewall is a ring.

* * * * *